United States Patent
Yu et al.

(10) Patent No.: US 10,903,441 B2
(45) Date of Patent: Jan. 26, 2021

(54) SINGLE-LAYER LIGHT-EMITTING DIODES USING ORGANOMETALLIC HALIDE PEROVSKITE/IONIC-CONDUCTING POLYMER COMPOSITE

(71) Applicant: The Florida State University Research Foundation, Inc., Tallahassee, FL (US)

(72) Inventors: Zhibin Yu, Tallahassee, FL (US); Junqiang Li, Tallahassee, FL (US); Sri Ganesh Rohit Bade, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/836,321

(22) Filed: Dec. 8, 2017

(65) Prior Publication Data
US 2018/0102494 A1    Apr. 12, 2018

Related U.S. Application Data

(63) Continuation of application No. PCT/US2016/036386, filed on Jun. 8, 2016.
(Continued)

(51) Int. Cl.
*H01L 51/50* (2006.01)
*C09K 11/06* (2006.01)
(Continued)

(52) U.S. Cl.
CPC .......... *H01L 51/5032* (2013.01); *C09K 11/02* (2013.01); *C09K 11/06* (2013.01);
(Continued)

(58) Field of Classification Search
CPC ....... H01B 1/20; H05B 33/14; H01L 51/5221; H01L 51/5206; H01L 51/0077;
(Continued)

(56) References Cited

U.S. PATENT DOCUMENTS 9,349,967 B2 * 5/2016 Lee ..................... H01L 51/0077
9,425,396 B2 * 8/2016 Irwin .................. H01L 51/0003
(Continued)

FOREIGN PATENT DOCUMENTS

| JP | 2015-141944 A | 8/2015 | |
| WO | WO-2014045021 A1 * | 3/2014 | .......... H01L 51/422 |
| WO | 2015159192 A1 | 10/2015 | |

OTHER PUBLICATIONS

Song et. al., "Perovskite solar cells: film formation and properties", Journal of Material Chemistry A, Royal Society of Chemistry (Year: 2015).*

(Continued)

*Primary Examiner* — Allen L Parker
*Assistant Examiner* — Charles N Ausar-El
(74) *Attorney, Agent, or Firm* — Eversheds Sutherland (US) LLP

(57) ABSTRACT

Single-layer LEDs were developed using a composite thin film of organometal halide perovskite (Pero) and poly (ethylene oxide) (PEO). Single-layer Pero LEDs have a device structure that resembles "bottom electrode (ITO)/Pero-PEO/ top electrode (In/Ga or Au)". Green emission LEDs with methylammonium lead bromide (bromide-Pero) and PEO composite thin films exhibit a low turn-on voltage of about 2.8-3.1 V (defined at 1 cd m$^{-2}$ luminance), a maximum luminance of 4064 cd m$^{-2}$ and a moderate maximum current efficiency of about 0.24-0.74 cd A$^{-1}$. Blue and red emission LEDs have also been fabricated using Cl/Br or Br/I alloyed Pero-PEO composite thin films.

13 Claims, 14 Drawing Sheets

Related U.S. Application Data

(60) Provisional application No. 62/172,499, filed on Jun. 8, 2015.

(51) Int. Cl.

| | | |
|---|---|---|
| *H01B 1/20* | (2006.01) | |
| *H05B 33/14* | (2006.01) | |
| *C09K 11/02* | (2006.01) | |
| *H01L 51/00* | (2006.01) | |
| *H01L 51/52* | (2006.01) | |
| *H01L 51/42* | (2006.01) | |

(52) U.S. Cl.
CPC ............ *H01B 1/20* (2013.01); *H01L 51/0003* (2013.01); *H01L 51/004* (2013.01); *H01L 51/0026* (2013.01); *H01L 51/0077* (2013.01); *H01L 51/5206* (2013.01); *H01L 51/5221* (2013.01); *H05B 33/14* (2013.01); *C09K 2211/185* (2013.01); *C09K 2211/188* (2013.01); *H01L 51/4253* (2013.01)

(58) Field of Classification Search
CPC ............... H01L 51/004; H01L 51/0026; H01L 51/0003; H01L 51/5032; C09K 11/06; C09K 11/02
USPC .......................................................... 257/40
See application file for complete search history.

(56) References Cited

U.S. PATENT DOCUMENTS

| | | | | |
|---|---|---|---|---|
| 9,583,724 | B2* | 2/2017 | Huang | H01L 51/4213 |
| 9,768,395 | B2* | 9/2017 | Lee | H01L 51/0032 |
| 9,905,765 | B2* | 2/2018 | Ma | H01L 51/0034 |
| 9,997,707 | B2* | 6/2018 | Wang | H01L 51/424 |
| 10,069,025 | B2* | 9/2018 | Snaith | H01L 51/422 |
| 10,079,320 | B2* | 9/2018 | Snaith | H01L 31/0264 |
| 10,115,917 | B2* | 10/2018 | Marks | H01L 51/0036 |
| 2003/0186522 | A1 | 10/2003 | Duan et al. | |
| 2005/0003645 | A1 | 1/2005 | Hirai | |
| 2008/0238882 | A1 | 10/2008 | Sivarajan et al. | |
| 2009/0230872 | A1* | 9/2009 | Kuroda | G06F 3/03545 315/158 |
| 2012/0073639 | A1* | 3/2012 | Park | B82Y 10/00 136/255 |
| 2012/0125414 | A1* | 5/2012 | Kamezaki | H01G 9/2072 136/255 |
| 2013/0306950 | A1* | 11/2013 | Middleton | H01L 51/0039 257/40 |
| 2014/0238482 | A1* | 8/2014 | Ichibayashi | C07C 13/64 136/256 |
| 2015/0030783 | A1 | 1/2015 | Suganuma et al. | |
| 2015/0060773 | A1* | 3/2015 | Liang | H01L 51/4293 257/40 |
| 2015/0122314 | A1* | 5/2015 | Snaith | H01L 51/4213 136/255 |
| 2015/0129034 | A1* | 5/2015 | Snaith | H01L 51/4213 136/258 |
| 2015/0136232 | A1* | 5/2015 | Snaith | H01L 51/4226 136/263 |
| 2015/0144195 | A1* | 5/2015 | Irwin | H01L 51/422 136/260 |
| 2015/0249170 | A1* | 9/2015 | Snaith | H01L 51/422 136/256 |
| 2015/0295194 | A1* | 10/2015 | Kanatzidis | H01L 51/0032 136/263 |
| 2016/0141535 | A1* | 5/2016 | Snaith | H01L 51/0003 136/263 |
| 2016/0218307 | A1* | 7/2016 | Huang | H01L 51/4213 |
| 2016/0248028 | A1* | 8/2016 | Huang | H01L 51/0002 |
| 2016/0254472 | A1* | 9/2016 | Wang | H01L 51/424 136/263 |
| 2016/0268510 | A1* | 9/2016 | Moon | H01L 51/424 |
| 2016/0276413 | A1* | 9/2016 | Iida | H01L 27/301 |
| 2016/0343965 | A1* | 11/2016 | Marks | H01L 51/4213 |
| 2017/0047530 | A1* | 2/2017 | Ma | H01L 51/0034 |
| 2017/0133163 | A1* | 5/2017 | Russell | H01L 51/0077 |
| 2017/0243698 | A1* | 8/2017 | Kanei | H01L 51/448 |
| 2017/0243699 | A1* | 8/2017 | Beaumont | H01L 51/4226 |
| 2017/0338045 | A1* | 11/2017 | Vak | H01L 51/0004 |
| 2018/0006254 | A1* | 1/2018 | Mohite | H01L 51/0003 |
| 2018/0040769 | A1* | 2/2018 | Gao | H01L 33/005 |
| 2018/0066383 | A1* | 3/2018 | Bakr | C30B 7/00 |
| 2018/0096796 | A1* | 4/2018 | Yang | H01L 51/0064 |
| 2018/0102494 | A1* | 4/2018 | Yu | H01L 51/5206 |
| 2018/0174761 | A1* | 6/2018 | Kamino | H01L 51/4226 |
| 2018/0175112 | A1* | 6/2018 | Robinson | H01L 27/302 |
| 2018/0298278 | A1* | 10/2018 | Zhong | B82Y 20/00 |
| 2018/0369861 | A1* | 12/2018 | Katori | B05D 3/002 |
| 2019/0267559 | A1* | 8/2019 | Liu | H01L 51/428 |

OTHER PUBLICATIONS

Tan et. al., "Bright light-emitting diodes based on organometal halide perovskite," Nature Nanotechnology, vol. 9, Sep. 2014; published online: Aug. 3, 2014; doi: 10.1038; pp. 687-692 (Year: 2014).*

Li et al., Single-Layer Light-Emitting Diodes Using Organometal Halide Perovskite/Poly(ethylene oxide) Composite Thin Films. Advanced Materials. 2015. vol. 27 (35): 5196-5202.

Translation of Japanese Publication No. JP2015141944A (filing date: Jan. 27, 2014) with a publication date of Aug. 3, 2015; Assignee: Konica Minolta Inc.

International Search Report and Written Opinion for PCT/US16/59450 (filing date: Oct. 28, 2016) dated Feb. 15, 2017; Applicant: The Florida State University Research Foundation, Inc.

Green et al., The emergence of perovskite solar cells. Nat. Photonics. 2014. vol. 8: 506-514.

Kazim et al., Perovskite as light harvester: a game changer in photovoltaics. Angew. Chem. Int. Ed. 2014. vol. 53: 2812-2824.

Dong et al., Solar cells. Electron-hole diffusion lengths > 175 μm in solution-grown CH3NH3PbI3 single crystals. Science. 2015. vol. 347 (Issue 6225): 967-970.

Tan et al., Bright light-emitting diodes based on organometal halide perovskite. Nat. Nanotechnol. 2014. vol. 9: 687-692.

Zhou et al., Interface engineering of highly efficient perovskite solar cells. Science. 2014. vol. 345 (Issue 6196): 542-546.

Xing et al., Low-temperature solution-processed wavelength-tunable perovskites for lasing. Nat. Mater. 2014. vol. 13: 476-480.

Zhang et al., Brightly Luminescent and Color-Tunable Colloidal CH3NH3PbX3 (X=Br, I, Cl) Quantum Dots: Potential Alternatives for Display Technology. ACS Nano 2015. vol. 9 (No. 4): 4533-4542.

Chondroudis and Mitzi. Electroluminescence from an Organic-Inorganic Perovskite Incorporating a Quaterthiophene Dye within Lead Halide Perovskite Layers. Chem. Mater. 1999. vol. 11: 3028-3030.

Era et al., Organic-inorganic heterostructure electroluminescent device using a layered perovskite semiconductor (C6H5C2H4NH3)2PbI4. Appl. Phys. Lett. 1994. vol. 65 (No. 6): 676-678.

Hattori et al., Highly efficient electroluminescence from a heterostructure device combined with emissive layered-perovskite and an electron-transporting organic compound Chem. Phys. Lett. 1996. vol. 254: 103-108.

Hoye et al., Enhanced performance in fluorene-free organometal halide perovskite light-emitting diodes using tunable, low electron affinity oxide electron injectors. Adv. Mater. 2015. vol. 27: 1414-1419.

Kim et al., Multicolored organic/inorganic hybrid perovskite light-emitting diodes. Adv. Mater. 2015. vol. 27: 1248-1254.

Li et al., Efficient light-emitting diodes based on nanocrystalline perovskite in a dielectric polymer matrix. Nano Lett. 2015. vol. 15: 2640-2644.

(56) References Cited

OTHER PUBLICATIONS

Yu et al., High-Performance Planar Perovskite Optoelectronic Devices: A Morphological and Interfacial Control by Polar Solvent Treatment. Adv. Mater. 2015. vol. 27: 3492-3500.

Aygüler et al., Light-Emitting Electrochemical Cells Based on Hybrid Lead Halide Perovskite Nanoparticles. J. Phys. Chem. C. 2015. vol. 119: 12047-12054.

Wang et al., Interfacial control toward efficient and low-voltage perovskite light-emitting diodes. Adv. Mater. 2015. vol. 27: 2311-2316.

Tang et al., Organic electroluminescent diodes. Appl. Phys. Lett. 1987. vol. 51 (No. 12): 913-915.

Gustafsson et al., Flexible light-emitting diodes made from soluble conducting polymers. Nature 1992. vol. 357: 477-479.

Walzer et al., Highly Efficient Organic Devices Based on Electrically Doped Transport Layers. Chem. Rev. 2007 vol. 107: 1233-1271.

Watanabe et al., High-Efficiency Phosphorescent OLEDs using Chemically Doped Layers. J. Photopolym. Sci. Technol. 2005. vol. 18 (No. 1): 83-86.

Xiao et al., Giant switchable photovoltaic effect in organometal trihalide perovskite devices Nat. Mater. 2015. vol. 14: 193-198.

Armstrong et al., Light-emitting electrochemical processes. Annu. Rev. Phys. Chem. 2001. vol. 52: 391-422.

Chen et al., Single-layer triplet white polymer light-emitting diodes incorporating polymer oxides: Effect of charge trapping at phosphorescent dopants. Applied Physics Letters. 2009. vol. 94: 043306.

International Search Report and Written Opinion for PCT/US16/36386 (filing date: Jun. 8, 2016) dated Sep. 6, 2016; Applicant: The Florida State University Research Foundation, Inc.

International Preliminary Report on Patentability for PCT/US2016/036386 (filing date: Jun. 8, 2016) with a priority date of Jun. 8, 2015; Applicant: The Florida State University Research Foundation, Inc.

\* cited by examiner

SINGLE-LAYER LIGHT-EMITTING DIODES USING ORGANOMETALLIC HALIDE PEROVSKITE/IONIC-CONDUCTING POLYMER COMPOSITE

CROSS-REFERENCE TO RELATED APPLICATIONS

This application is a continuation of and claims priority to International Patent Application No. PCT/US2016/036386, entitled "SINGLE-LAYER LIGHT-EMITTING DIODES USING ORGANOMETALLIC HALIDE PEROVSKITE/IONIC-CONDUCTING POLYMER COMPOSITE", filed Jun. 8, 2016 by the same inventors, which claims priority to U.S. Provisional Patent Application No. 62/172,499, entitled "SINGLE-LAYER LIGHT-EMITTING DIODES USING ORGANOMETALLIC HALIDE PEROVSKITE/IONIC-CONDUCTING POLYMER COMPOSITE", having a filing date of Jun. 8, 2015, the entirety of which is hereby incorporated by reference

BACKGROUND OF THE INVENTION

Field of the Invention

This invention relates, generally, to light-emitting diodes (LEDs). More specifically, it relates to single-layer LEDs utilizing a composite thin film of organometal halide perovskite polymer.

Brief Description of the Prior Art

Organometal halide perovskite (Pero) materials have been intensively investigated in the past few years. Their exceptional electronic and optical properties, combining with the solution processability have made them ideal candidates for a new generation of large area, high performance optoelectronic devices. For example, solar cells employing a thin layer of methyl ammonium lead iodide as the absorber layer have achieved about 20% power conversion efficiency, approaching the state-of-the-art performance of polycrystalline thin film solar cells. Pero materials also exhibit high photoluminescence yield and the emission color can be tuned to cover the whole visible spectrum, thus they are potentially valuable in light-emitting diodes (LEDs) for information displays and lighting luminaires. In the early works, electroluminescence of Pero LEDs had been observed at cryogenic temperatures. More recently, researchers have made Pero LEDs that illuminate at ambient temperature and emit different colors.

All reported Pero LEDs contained a multi-layer device architecture normally including a thin layer adjacent to the anode for assisting hole injection (hole-injection layer, HIL); a layer of Pero for emitting light; and a layer next to the cathode for enhancing electron injection (electron-injection layer, EIL). Such a multi-layer approach is well established in organic LEDs (OLEDs) based on small molecule organic semiconductors or conjugated polymers. The use of a HIL and EL has been shown to lower the hole/electron injection energy barriers, resulting in low operation voltage and high electroluminescence efficiency in OLEDs. However, the role and importance of HIL and EIL layers in Pero LEDs has not yet been systematically studied. Recent work has indicated that the Pero material could be polarized under external electrical field to form a p-i-n homojunction. In this regard, efficient LEDs may be achieved simply using a single-layer Pero thin film sandwiched between two opposite electrodes without using any HIL or EL.

Accordingly, what is needed is a method for forming single-layer Pero LEDs. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

Various embodiments may comprise a method for producing a single layer thin film optoelectric device. An organometal halide perovskite (Pero) precursor may be formed. An ionic-conducting polymer (ICP) may be added to the Pero precursor to form a Pero-ICP precursor. A substrate may be coated with the Pero-ICP precursor to form a Pero-ICP composite layer. The Pero-ICP composite layer may then be annealed.

Additional embodiments may comprise a method for producing a single layer thin film optoelectric device. An organometal halide perovskite (Pero) precursor may be formed by dissolving methylammonium chloride ($CH_3NH_3Cl$) and lead chloride ($PbCl_2$) in a dimethylsulfoxide, or by dissolving methylammonium bromide ($CH_3NH_3Br$) and lead bromide ($PbBr_2$) in N,N-dimethylformamide, or by dissolving methylammonium iodide ($CH_3NH_3I$) and lead iodide ($PbI_2$) in N,N-dimethylformamide. Poly(etheylene oxide) polymer (PEO) may be added to the Pero precursor to form a Pero-PEO precursor. A substrate may be coated with the Pero-PEO precursor to form a layer of Pero-PEO composite on the substrate. The Pero-PEO composite layer may then be annealed.

Still further embodiments may comprise a single layer thin film optoelectronic device. The device may comprise an anode, a photoactive layer and a cathode. The photoactive layer comprises a methylammonium lead halide ($CH_3NH_3PbX_3$) deposited from a mixture of methylammonium halide ($CH_3NH_3X$) and lead halide ($PbX_2$), where X is a halide, and ion-conducting polymer in a solution of dimethylformamide or dimethylsulfoxide, and thermally annealed.

The long-standing but heretofore unfulfilled need for single-layer Pero devices is now met by a new, useful, and nonobvious invention.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
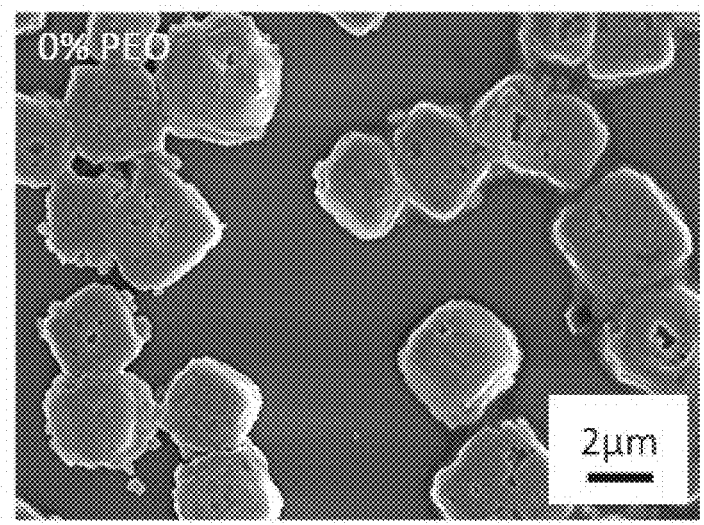
FIG. 1 is a SEM image of bromide-Pero thin film without PEO.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

In various embodiments, single-layer LEDs were developed using a composite thin film of Pero and poly(ethylene oxide) (PEO), an ionic-conducting polymer (ICP). The ionic-conducting polymer (PEO or other oligomers or polymers of ethylene oxide, or other conducting polymer) has been found to facilitate the migration of ionic species in the composite for forming a p-i-n junction in the LEDs. In contrast to the multi-layer strategy, a simplified device structure may be advantageous in terms of processing flexibility and fabrication cost at the manufacturing stage. Single-layer Pero LEDs have a device structure that resembles "bottom electrode (ITO)/Pero-PEO/top electrode (In/Ga or Au)". In spite of the simple device structure, the green emission LEDs with methylammonium lead bromide (bromide-Pero) and PEO composite thin films exhibit a low turn-on voltage of about 2.8-3.1V (defined at 1 cd m$^{-2}$ luminance), intense luminance of about 4,000 cd m$^{-2}$ and a high current efficiency of about 0.24-0.74 cd A$^{-1}$. All metrics compare favorably with reported results in literature involving a more complex multi-layer device structure. Blue and red emission LEDs have also been fabricated using Cl/Br or Br/I alloyed Pero-PEO composite thin films. In various embodiments, the ionic conductivity of the PEO may play a role in the success of single-layer Pero LEDs: in control experiments, polyvinylidene fluoride (PVDF) or polystyrene (PS) was used to replace the PEO and very poor or no light emission was seen.

Although the present disclosure involves optoelectronic devices comprising poly(ethylene oxide) as the conducting polymer, the scope of the present disclosure is not limited by the specific devices and structures presented herein. For example, the conducting polymer may comprise any suitable electron conducting polymer, proton conducting polymer, or ion conducting polymer. Further examples of the conducting polymer may comprise polysaccharide polymers, as well as conjugated polymers such as polyacetylene and analogues, polypyrrole, polythiophene, polyphenylene and analogues, poly(p-phenylene vinylene), and polyanaline.

The Pero-PEO composite thin films were obtained by a one-step spin coating process from a mixture solution containing the Pero precursor and PEO in dimethylformamide (DMF). For the green emission LEDs, methylammonium bromide and lead(II) bromide were used as the Pero precursors. In general, the Pero precursor may comprise a mixture of AX and BX, where A is a cation, B is a metal, and X is a halide ion. In various embodiments, A may comprise methylammonium ($CH_3NH_3$), formamidinium ($NH_2CHNH_2$), cesium (Cs), or mixtures thereof. B may comprise lead (Pb), tin (Sn), germanium (Ge), or mixtures thereof. X may comprise fluoride (F$^-$), chloride (Cl$^-$), bromide (Br$^-$), iodide (I$^-$), astatide (At$^-$), or mixtures thereof.

Figure 2:
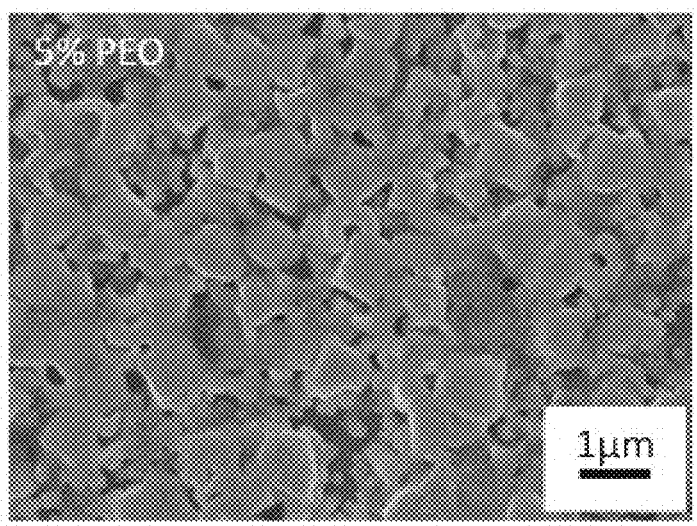
FIG. 2 is a SEM image of a bromide-Pero/PEO composite thin films with PEO content of 5% by weight. The relative weight ratio of PEO over the total weight of the Pero was used as the concentration of PEO in the composite thin films.
Figure 3:
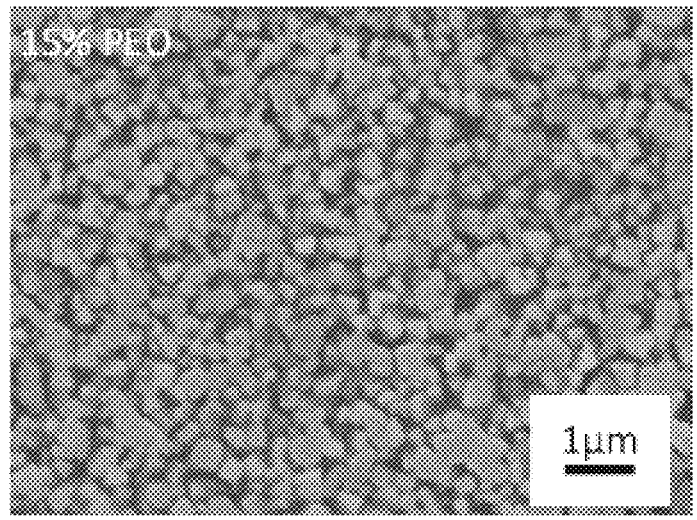
FIG. 3 is a SEM image of a bromide-Pero/PEO composite thin films with PEO content of 15% by weight. The relative weight ratio of PEO over the total weight of the Pero was used as the concentration of PEO in the composite thin films.
Figure 4:
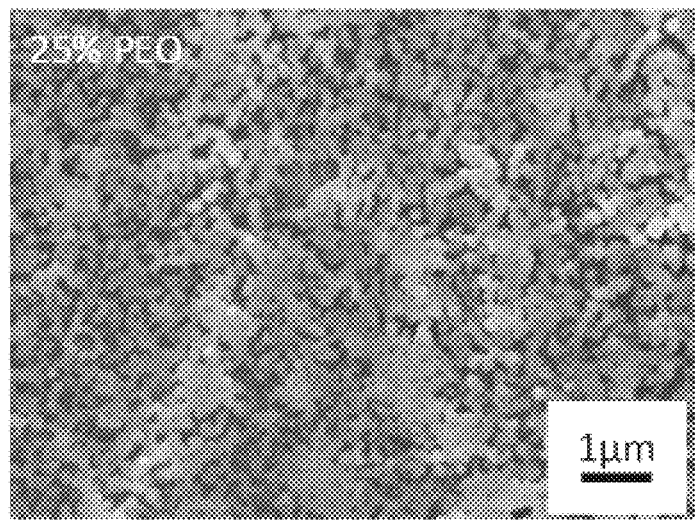
FIG. 4 is a SEM image of a bromide-Pero/PEO composite thin films with PEO content of 25% by weight. The relative weight ratio of PEO over the total weight of the Pero was used as the concentration of PEO in the composite thin films.
Figure 5:
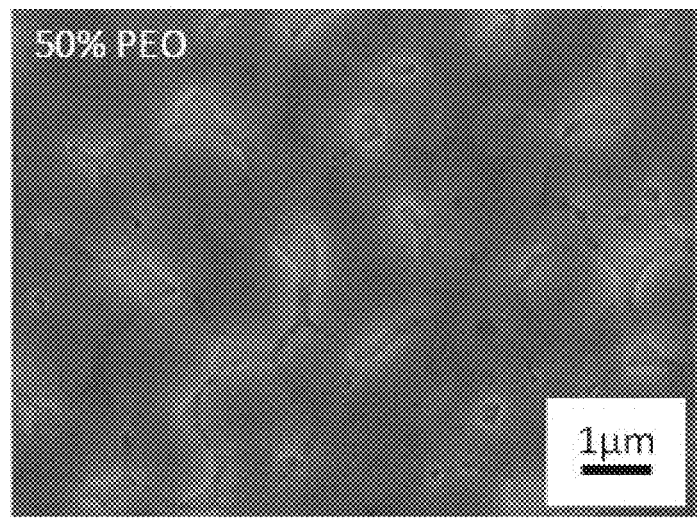
FIG. 5 is a SEM image of a bromide-Pero/PEO composite thin films with PEO content of 50% by weight. The relative weight ratio of PEO over the total weight of the Pero was used as the concentration of PEO in the composite thin films.
Figure 6:
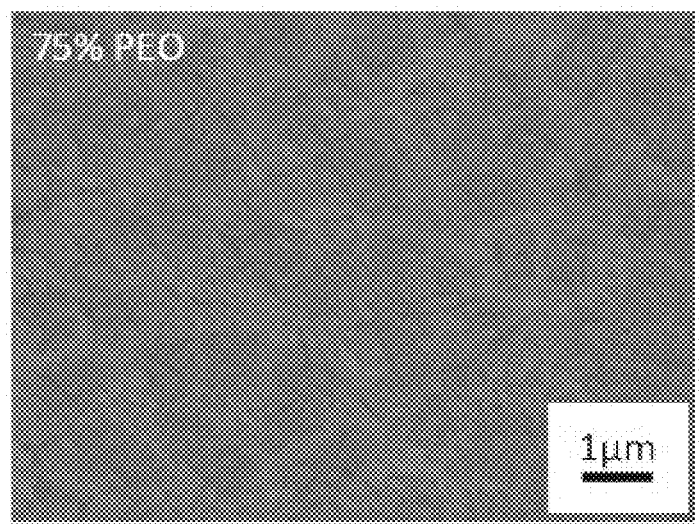
FIG. 6 is a SEM image of a bromide-Pero/PEO composite thin films with PEO content of 75% by weight. The relative weight ratio of PEO over the total weight of the Pero was used as the concentration of PEO in the composite thin films.
Figure 7:
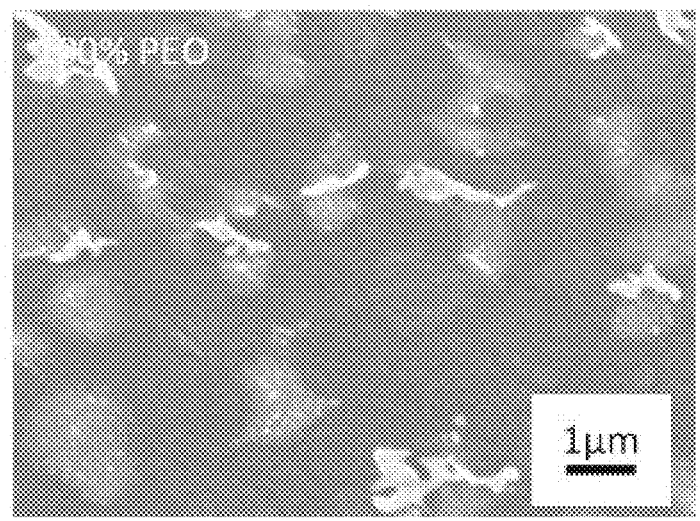
FIG. 7 is a SEM image of a bromide-Pero/PEO composite thin films with PEO content of 100% by weight. The relative weight ratio of PEO over the total weight of the Pero was used as the concentration of PEO in the composite thin films.
Figure 8:
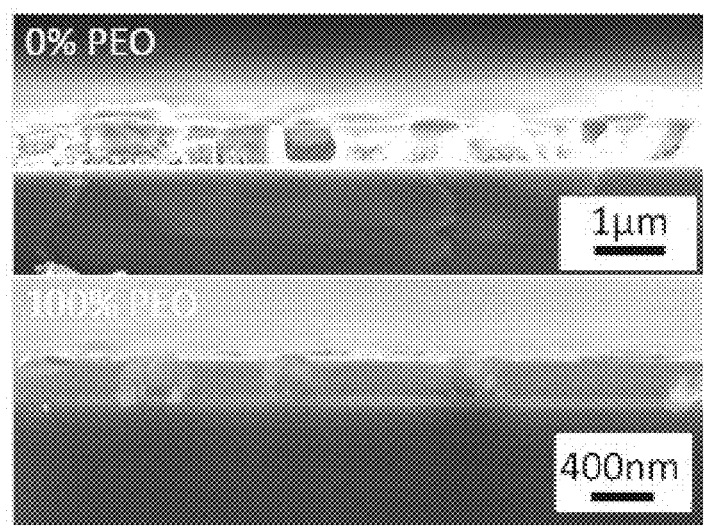
FIG. 8 is a SEM cross-sectional image of bromide-Pero only on a silicon/$SiO_2$ (50 nm) substrate (top image) and 100% N PEO composite thin film (bottom image) on a silicon/$SiO_2$ (50 nm) substrate. The relative weight ratio of PEO over the total weight of the Pero was used as the concentration of PEO in the composite thin films.

The relative weight ratio of PEO over the total weight of the Pero precursor was recorded as the concentration of PEO in the composite thin films. The scanning electron microscope (SEM) images in FIGS. 1 through 8 manifest the morphology evolution of the bromide-Pero/PEO composite with increasing PEO concentration. In the bromide-Pero only film (FIG. 1, 0% PEO), faceted crystals formed with size in the 3-5 μm range. Some crystals connected with surrounding ones forming larger sized islands. Nonetheless, the overall coverage of Pero on the substrate was low (about 50%). This is detrimental for LED fabrication, as all devices will be short circuited if the second electrode is directly laid on top of such a discontinuous Pero layer. A smooth and pinhole-free film was readily obtained by incorporating PEO with the Pero. As illustrated in FIGS. 2 through 7, when the PEO concentration increases, the crystal size gets noticeably smaller and the surface coverage greatly improves (FIGS. 2, 3, and 4). For example, when 5% PEO was used, the crystal size reduced to about 1 μm and surface coverage increased to >80%; to 200-500 nm grain size and >900/% coverage for 15% PEO; and to about 100 nm grain size and >95% coverage for 25% PEO. When the PEO concentration reached 50%, no crystal grains could be resolved in the SEM images (FIG. 5), implying that the Pero crystals had further reduced in size and dispersed more uniformly within the composite. At this point, the composite films appeared continuous; though there existed certain height contrast in FIG. 5 due to the surface roughness. At 75% PEO concentration, the film became smoother, more continuous and pinhole free. At higher PEO concentration, excess PEO appeared to precipitate out and form micrometer sized particles on top of the composite films (FIG. 7). FIG. 8 compares the cross-section SEM images of pure bromide-Pero and a composite thin film with 100% PEO. Both agree with the morphology top view SEM images in FIGS. 1 and 7. The composite film with 100% PEO had a thickness of about 240 nm.

It is believed that the viscous PEO polymer hinders the diffusivity of the Pero precursor at the solvent drying stage during spin-coating; which leads to smaller size and thus more uniform Pero precipitates within the PEO matrix. Unlike polyimide precursors or CBP, the PEO used in various embodiments is known for its good ionic conductivity, which played a role for the success of single-layer Pero LEDs as discussed below.

Figure 9:
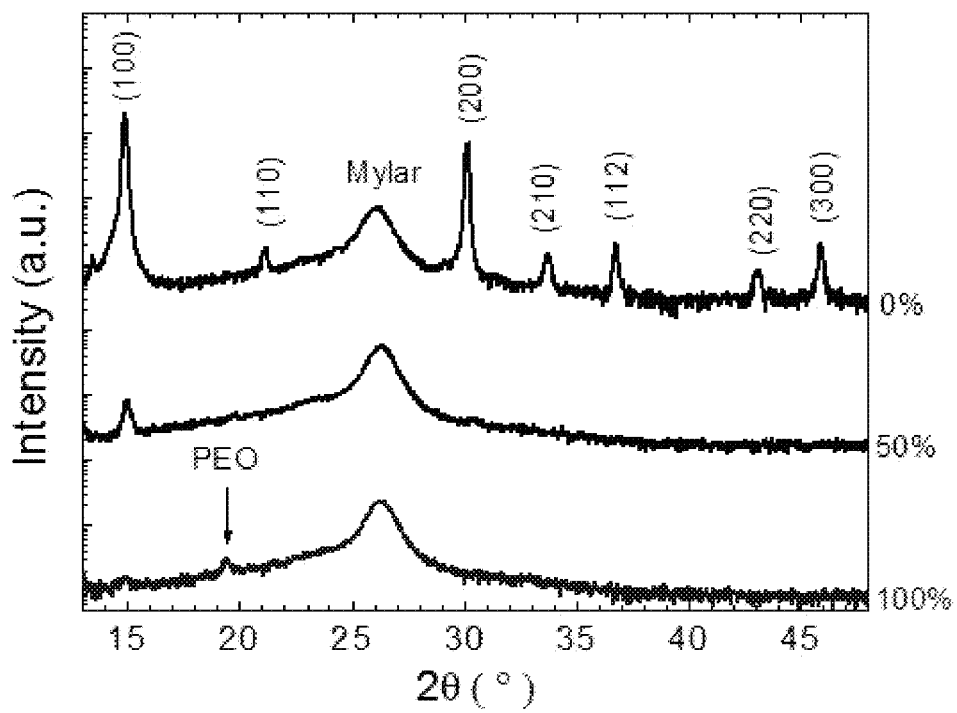
FIG. 9 illustrates XRD patterns of bromide-Pero only, and bromide-Pero/PEO composite thin films with indicated PEO contents.

The crystallinity of the composite films were characterized by X-ray diffraction (XRD). FIG. 9 shows θ-2θ scans taken from Pero film or the composite films with different PEO contents. Each sample was coated on a glass substrate. To avoid material degradation in air during the measurement, the sample was encapsulated with a Mylar sheet, which gave a broad XRD signal with peak position located at about 26° in each curve. The diffraction peaks correlated to bromide-Pero crystals are indexed in FIG. 9. The calculated lattice constant was about 5.91 Å (14.98°) using the Bragg Equation, which was close to literature values. There was a clear trend of decreasing diffraction intensities with the increasing PEO content; this was attributed to the decreased perovskite concentration in the composite. Nevertheless, a dim (100) peak could still be resolved even for the 100% PEO (PEO/bromide-Pero=1) sample. In addition, the diffraction peak of PEO at about 19° became pronounced in composite films with high PEO concentration (100%), verifying the SEM study in FIG. 7.

Figure 10:
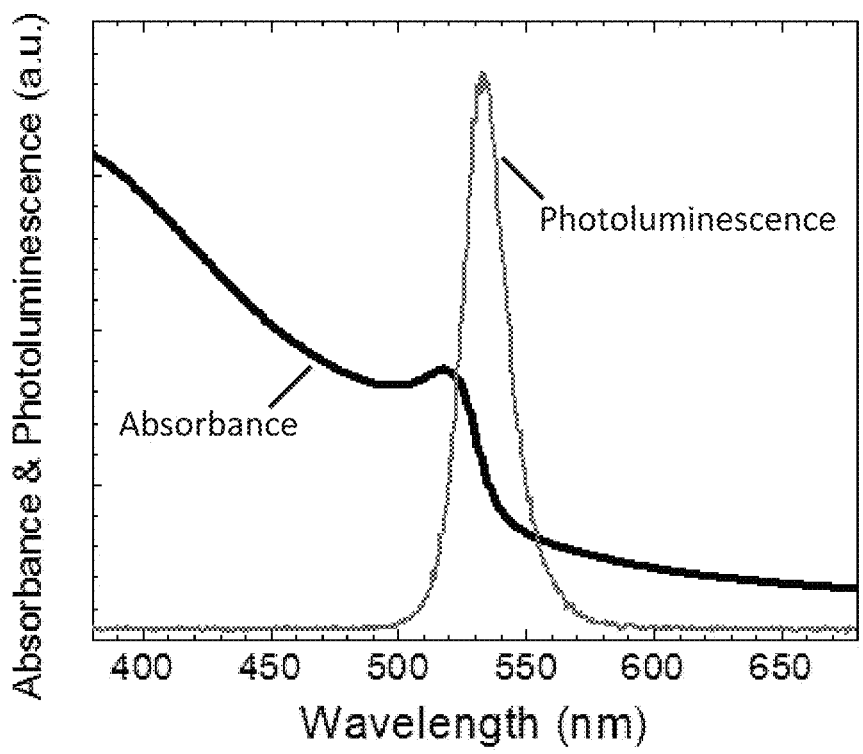
FIG. 10 illustrates absorbance and photoluminescence spectrum of the bromide-Pero/PEO composite thin film with 50% PEO by weight.

To evaluate the optical properties of the composite thin films, absorption and photoluminescence (PL) spectra were both collected as shown in FIG. 10. Notably, the absorption spectrum exhibited an abrupt transition around 530 nm, which was attributed to the bromide-Pero that possesses a direct bandgap at 2.3 eV. The PL spectrum has peak position at 532 nm. All the PL spectra of composite thin films are similar in shape and peak position; however, the intensities decrease with the increasing PEO content due to the dilution of perovskite by the PEO. The above results indicated that bromide-Pero crystalized in the composite thin film, and the composite maintained the vital structural characteristics and optical properties of bromide-Pero.

Figure 11:
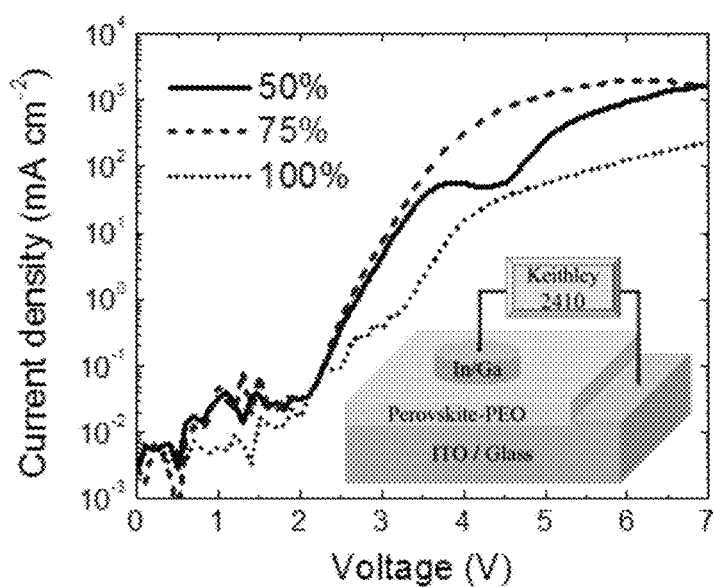
FIG. 11 illustrates current density of the single-layer Pero/PEO LEDs with 50% (solid line), 75% (dashed line) and 100% (dotted line) PEO by weight. The inset shows the LED device structure as "ITO anode/bromide-Pero and PEO composite/In—Ga cathode".
Figure 12:
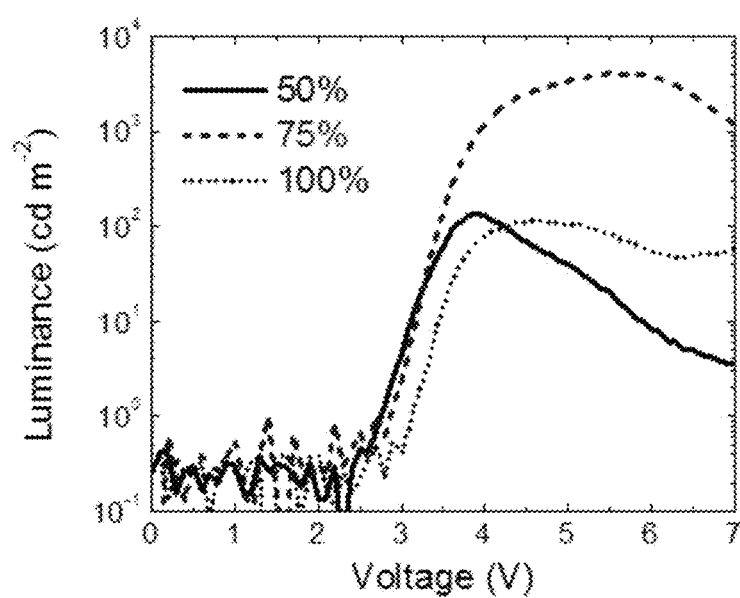
FIG. 12 illustrates luminance of the single-layer Pero/PEO LEDs with 50% (solid line), 75% (dashed line) and 100% (dotted line) PEO by weight.

After characterization of the Pero-PEO composite, LED devices were constructed using ITO/bromide-Pero and PEO composite/In—Ga, where ITO on glass served as the anode and In—Ga eutectic was used as the cathode (illustrated in inset of FIG. 11). The active area of the LED device was about 3 mm in diameter as defined by the size of the In—Ga electrode. Three control samples with different PEO content were examined, specifically 50%, 75%, and 100% Pero-PEO films. The current density-voltage and luminance-voltage characteristics are shown in FIGS. 12 and 12. The turn-on voltage (1 cd m$^{-2}$) was 2.8V, 2.9V and 3.1V for the 50%, 75% and 100% devices, respectively, which compared favorably to existing Pero LEDs utilizing a multi-layer device structure. For instance, in bromide-Pero LEDs, about 3.8V turn-on voltage was reported by Tan et al. using PEDOT:PSS as the HIL and poly(9,9'-dioctylfluorene)/Ca as the EIL; about 4.2V was reported by Kim et al. using PEDOT:PSS/perfluorinated polymeric acid as the HIL and 1,3,5-tris(1-phenyl-1H-benzimidazol-2-yl)benzene/LiF as the EIL; about 3.1V was reported by Li et al. using PEDOT:PSS as the HIL, a bromide-Pero/polyimide precursor as the emissive layer and poly(9,9'-dioctylfluorene)/Ca as the EIL. The low turn-on voltage in various embodiments of single-layer devices as disclosed herein demonstrated that efficient charge injection can be attained even without the use of HIL or EL in Pero LEDs.

Figure 13:
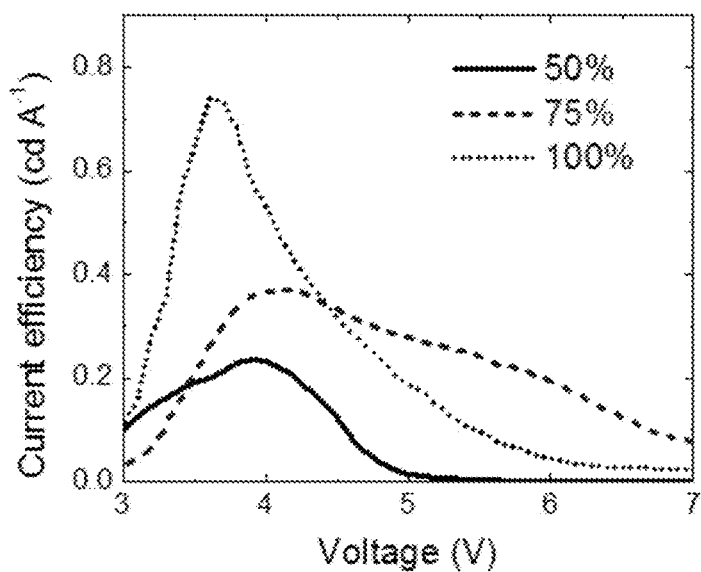
FIG. 13 illustrates current efficiency versus voltage characteristics of the single-layer Pero/PEO LEDs with 50% (solid line), 75% (dashed line) and 100% (dotted line) PEO by weight.
Figure 14:
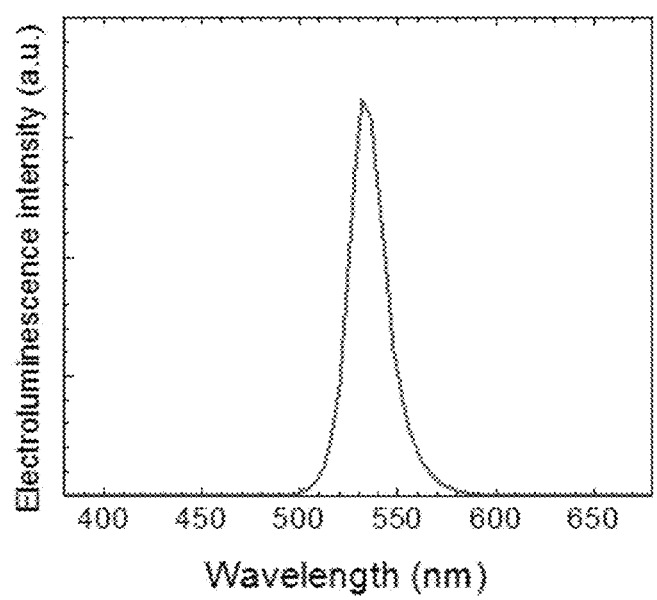
FIG. 14 illustrates a electroluminescence spectrum of the device with 75% PEO by weight under 4.5V bias.

The 75% PEO device had luminance intensity of about 1,000 cd m$^{-2}$ at 4V, reaching a maximum of 4,064 cd m$^{-2}$ at 5.5 V bias. The luminance intensity had a maximum of about 133 cd m$^{-2}$ for the 50% PEO device and 113 cd m$^{-2}$ for the 100% PEO device, which were both substantially lower than the 75% PEO device. This outcome suggests that it was ideal to have an intermediate PEO concentration when a fully continuous and uniform film was formed without excess PEO precipitates as revealed by the SEM images in FIGS. 5 through 7. The current efficiency versus voltage characteristics are presented in FIG. 13. The highest efficiency was 0.24 cd A$^{-1}$ (133.64 cd m$^{-2}$), 0.38 cd A$^{-1}$ (1778 cd m$^{-2}$), and 0.74 cd A$^{-1}$ (25 cd m$^{-2}$) for the 50%, 75% and 100% PEO devices, respectively. A representative electroluminescence spectrum is shown in FIG. 14; the peak intensity is located at 532 nm and the peak width is about 23 nm at half maximum intensity.

Figure 15:
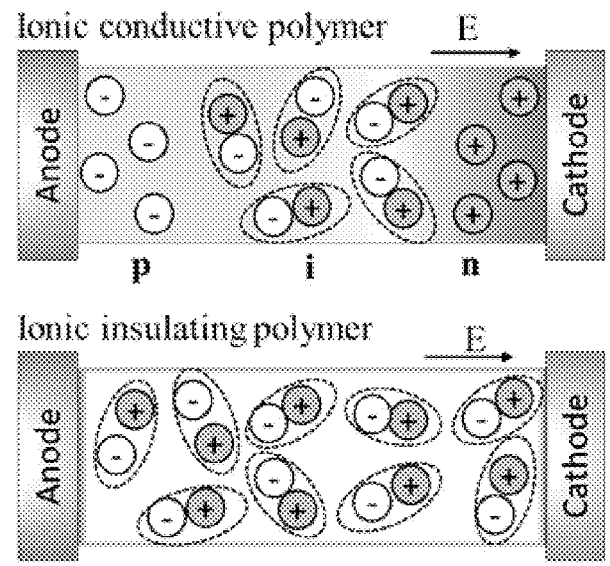
FIG. 15 is a schematic illustration of ion migration under an applied electric field in the Pero/polymer composite with ionic conductive polymer (top image) or ionic insulating polymer (bottom image). Cations and anions may be transported by the ionic conductive polymer and accumulate close to the electrodes, resulting in formation of p-i-n junction. Junction formation may not occur when an ionic insulating polymer is used.

To describe the above results, a hypothesis was developed for the underlying mechanism of the low turn-on voltage and high brightness in single-layer Pero/PEO LEDs. Since Pero materials are ionic compounds, the contained ionic species could migrate under external electrical field causing anion/cation accumulation near the anode/cathode interface and leading to a p-i-n homojunction (FIG. 15). Such a "poling" effect should also exist in our Pero/PEO composite thin films, since the PEO used here is known as a good ionic conductor, which would facilitate migration of the ionic species in the Pero/PEO composite causing p-i-n homojunction formation.

Figure 19:
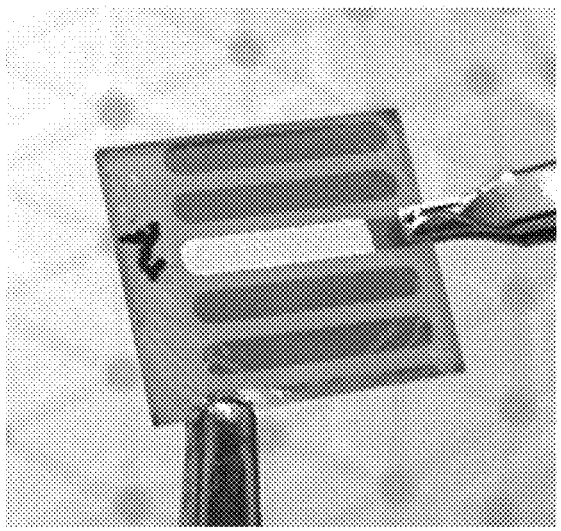
FIG. 19 is an emission photo of a bromide-Pero/PEO LED device at 4V. The LED structure is "ITO Glass/bromide-Pero and 75% PEO composite/Gold (Au, 80 nm)". Au electrode was evaporated using a Veeco E-beam evaporation system with a shadow mask to define the active device area as 2 mm×10 mm.

In addition, the junction formation will automatically diminish the energy barrier between the electrodes and the emissive layer, thus a high work function cathode can be used in the single-layer Pero/PEO LEDs. Devices were tested with an E-beam evaporated gold (Au) film which has a work function of 5.1 eV to replace the In/Ga (work function 4.1-4.2 eV) as the cathode. The final ITO/Pero composite/Au structured device emitted brightly. FIG. 19 shows an emission photo of such a device at 4V, in support of the junction formation mechanism.

Figure 16:
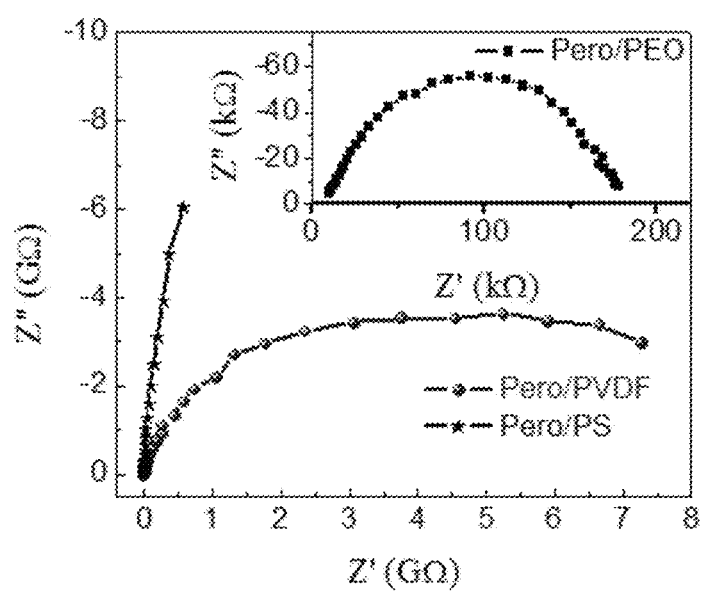
FIG. 16 is a Nyquist plot from impedance measurements of LEDs with bromide-Pero/PEO, bromide-Pero/PVDF, and bromide-Pero/PS.

To further test the hypothesis that PEO facilitates the migration of the ionic species control samples were prepared with the PEO replaced by a poor ionic conductor (PVDF) or an ionic insulating polymer (PS). The weight ratio of the control polymer to the Pero was 1:1 (i.e., 100% polymer). LEDs were fabricated with a device structure the same as the one used in FIG. 11. Impedance spectroscopy was used to investigate the ionic conductivity in each device. FIG. 16 presents the Nyquist plots for all three devices, demonstrating that the ionic conductivity of Pero/PEO composite was about 50,000 times higher than the Pero/PVDF composite. The ionic conductivity of the Pero/PS composite was too low to measure with the available equipment.

Figure 17:
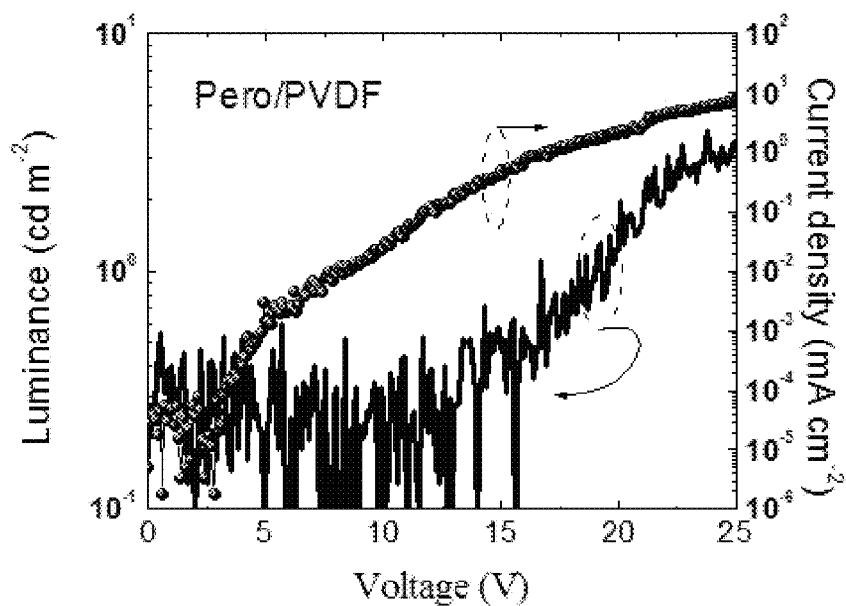
FIG. 17 is a graph of current density and luminance versus voltage characteristics of LED devices with bromide-Pero/PVDF.
Figure 18:
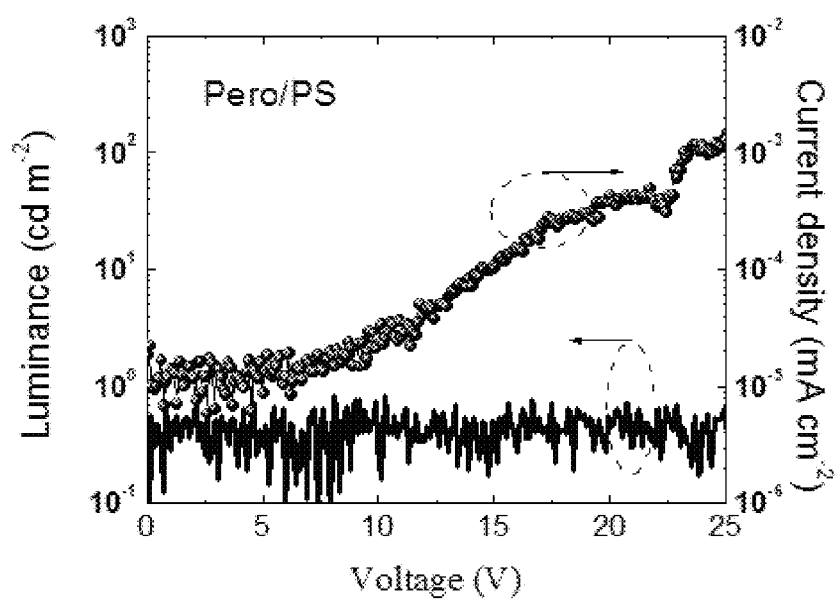
FIG. 18 is a graph of current density and luminance versus voltage characteristics of LED devices with bromide-Pero/PS composite thin films. The LEDs have a device structure of "ITO anode/bromide-Pero and polymer composite/In—Ga cathode".

The current density-voltage and corresponding luminance-voltage characteristics of the Pero/PVDF and Pero/PS composite devices are shown in FIGS. 17 and 18, respectively. The Pero/PVDF composite device turned on at about 19V (1 cd m$^{-2}$) and reached about 4 cd m$^{-2}$ at 25V. For the Pero/PS composite device no luminance could be detected even when the voltage increased to 25 V. The current densities in the PVDF and PS devices were also orders of magnitude lower than the PEO device. To this end, it is clear that the PEO not only improved the morphology, but also enhanced the ionic conductivity of the composite thin film, both of which contributed to the low driving voltage and high brightness in the single-layer bromide-Pero/PEO LEDs.

Figure 20:
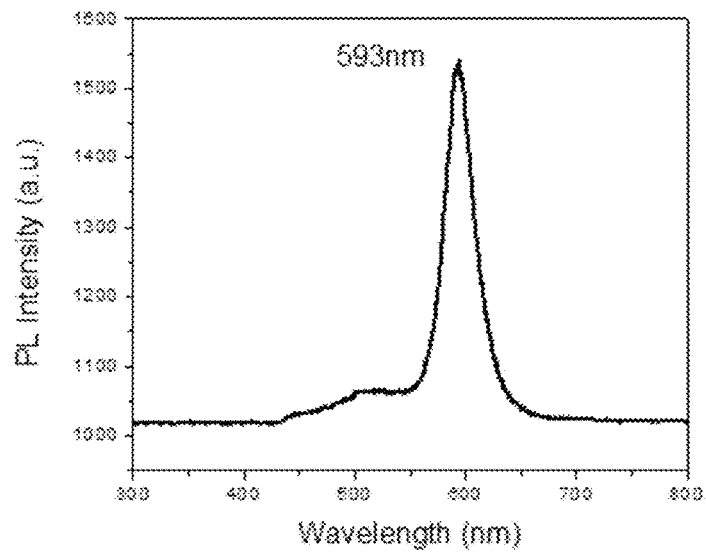
FIG. 20 is a graph of photoluminescence spectra of $CH_3NH_3PbBr_2I$/PEO composite films. The PEO content is 75% by weight. $CH_3NH_3PbBr_2I$ was obtained by mixing bromide-Pero and iodide-Pero in a 2:1 molar ratio.
Figure 21:
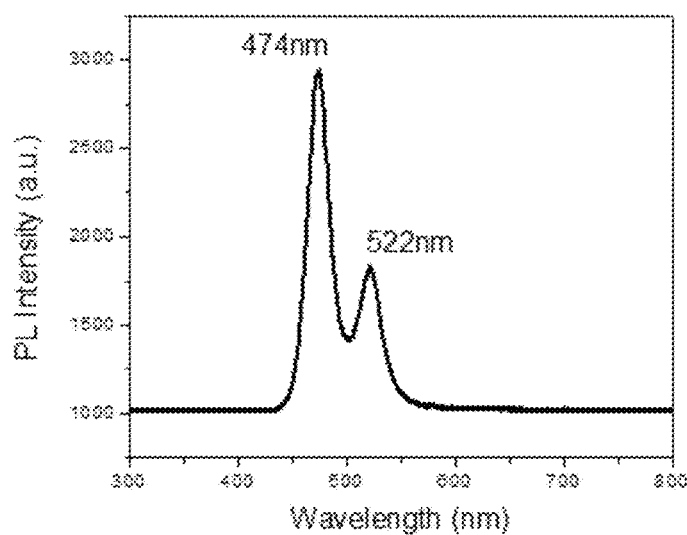
FIG. 21 is a graph of photoluminescence spectra of $CH_3NH_3PbCl_{1.8}Br_{1.2}$/PEO composite films. The PEO content is 75% by weight. $CH_3NH_3PbCl_{1.8}Br_{1.2}$ was obtained by mixing chloride-Pero and bromide-Pero in a 1.8:1.2 molar ratio.
Figure 22:
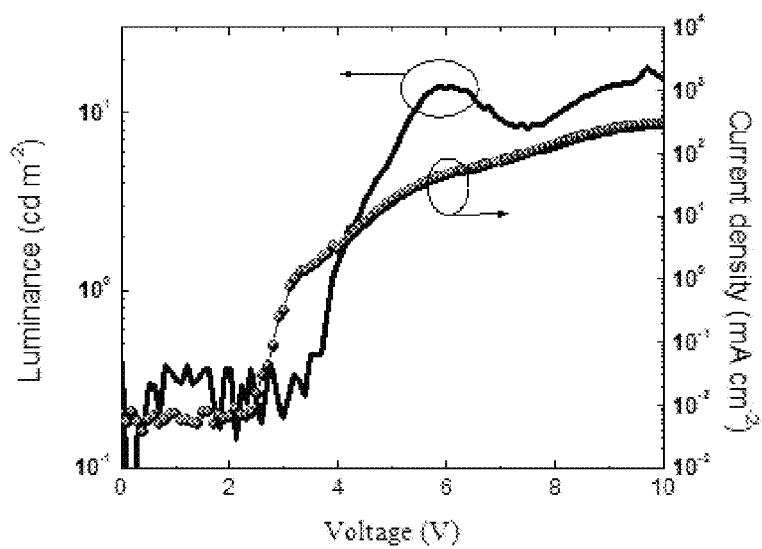
FIG. 22 is a graph of current density and luminance versus voltage characteristics of LEDs with $CH_3NH_3PbBr_2I$/PEO composite thin films.
Figure 23:
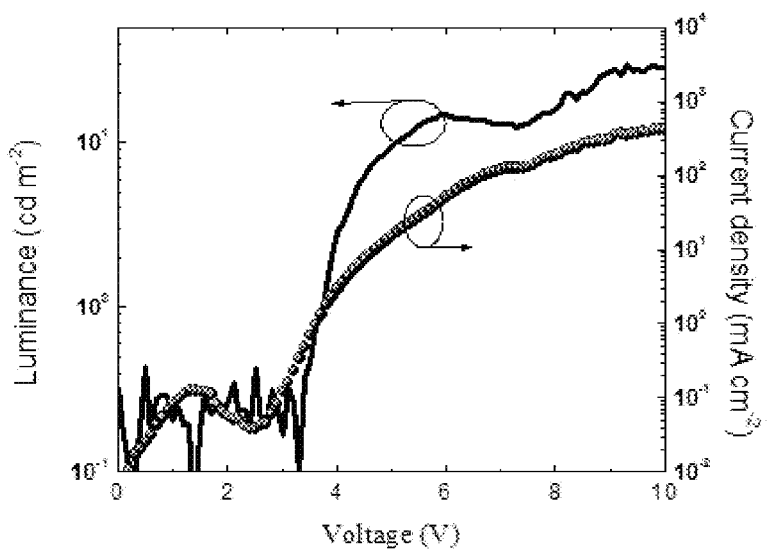
FIG. 23 is a graph of current density and luminance versus voltage characteristics of LEDs with $CH_3NH_3PbCl_{1.8}Br_{1.2}$/PEO composite thin films. The device structure is "ITO Glass/Pero and PEO composite/In—Ga".

The single-layer device structure is also applicable to other alloyed perovskite/PEO composite thin films. $CH_3NH_2PbBr_2I/PEO$ and $CH_3NH_2PbCl_{1.8}Br_{1.2}/PEO$ were examined that were prepared according to the procedure in the experimental section. The PL spectrum of $CH_3NH_2PbBr_2I/PEO$ had peak position at 593 nm with a weak and broad shoulder extending towards shorter wavelength direction (FIG. 20). The PL spectrum of the $CH_3NH_2PbCl_{1.8}Br_{1.2}/PEO$ exhibited double peaks at 474 nm and 522 nm (FIG. 21). LED devices were fabricated as ITO/$CH_3NH_2PbBr_2I$-PEO composite/In—Ga, or ITO/$CH_3NH_2PbCl_{1.8}Br_{1.2}/PEO$ composite/In—Ga. The red emission color matched the PL spectrum of the emissive layer. The Luminance-Voltage-Current density plot was presented in FIG. 22. The device turned on at 3.9V (1 cd m$^{-2}$), reaching luminance intensity of about 14 cd m$^{-2}$ and current efficiency of about 0.028 cd A$^{-1}$ at 6V, all of which were equivalent to results obtained in multi-layer LEDs using ITO/PEDOT:PSS/$CH_3NH_3PbBr_2I$/F8/Ca/Ag. LEDs with $CH_3NH_2PbCl_{1.8}Br_{1.2}/PEO$ emitted sky-blue light (FIG. 22), conforming to the PL spectrum of $CH_3NH_2PbCl_{1.8}Br_{1.2}/$PEO. The devices turned on at 3.8V (1 cd m$^{-2}$), reaching luminance intensity of about 15 cd m$^{-2}$ and current efficiency of about 0.03 cd A$^{-1}$ at 6V.

In summary, pinhole-free and uniform Pero/PEO composite thin films were developed using a one-step solution process. Single-layer LEDs have been fabricated with a simple device structure of "bottom electrode (ITO)/Pero composite thin film/top electrode (In/Ga or Au)". With 75% PEO weight percentage of bromide-Pero in the composite, the green LED exhibited a low turn-on voltage (2.9V) and high brightness (4,064 cd m$^{-2}$ at 5.5V). Both metrics compared favorably with reported data in multi-layer Pero LEDs. Red and blue emission LEDs have also been fabricated using Br/I or Cl/Br alloyed Pero-PEO composite thin films. The novel process and device structure of various embodiments may be useful for all existing and new arriving Pero materials to enable a new generation of scalable electro-optical devices in the future.

EXAMPLES

Materials:

Lead(II) chloride (99.999%), lead(II) bromide (99.999%), lead(II) iodide (99.999%), N,N-dimethylformamide (DMF, anhydrous, 99.8%), dimethyl sulfoxide (DMSO, anhydrous, 99.9%), poly(ethylene oxide) (average My about 600,000), poly(vinylidene fluoride) (average Mw about 530,000), polystyrene (average Mw about 400,000) and indium-gallium eutectic (99.99%) were purchased from Sigma-Aldrich. The methylammonium chloride, methylammonium bromide and methylammonium iodide were purchased from "1-Material Inc". All materials were used as received.

Film Preparation and Characterizations:

The Pero precursor solution was prepared by dissolving $PbX_2$ and $CH_3NH_3X$ in a 1:1.5 molar ratio in anhydrous DMF (for bromide and iodide-Pero) or DMSO (for chloride-Pero) to give a concentration of about 500 mg mL$^{-1}$. PEO was dissolved in DMF with concentration of 16 mg mL$^{-1}$. The Pero precursor and PEO solution were then mixed with desired ratio. All the solutions were stirred at 70° C. for 30 mins before use. The ITO/glass substrates (10 ohms sq$^{-1}$) were cleaned subsequently with detergent water, acetone and isopropanol for 30 mins with sonication, then blow dried with nitrogen and treated with oxygen plasma. The mixture solution was spun-coat onto the ITO/glass at 2000 rpm for 1 min and annealed at 60° C. for 3 min. Solution and film preparation, and following device testing were carried out inside a nitrogen filled glove box with oxygen and moisture level both at about 1 ppm. Commercial tools of Field Emission SEM (JEOL-7401F) and UV-Vis-NIR spectrometer (Varian Cary 5000) were used to characterize the composite thin films. The impedance spectra were collected in the dark using a VersaSTAT3 potentiostat/galvanostat at 1 V DC and 500 mV AC bias with a frequency range from 1 Hz to 100 kHz.

Led Measurement:

Current density-voltage and luminance-voltage characteristics were measured with a Keithley 2400 source meter and a silicon photodiode. The silicon photodiode was further calibrated by a photo research PR-655 spectroradiometer. Results are presented in the above discussion.

Figure 24:
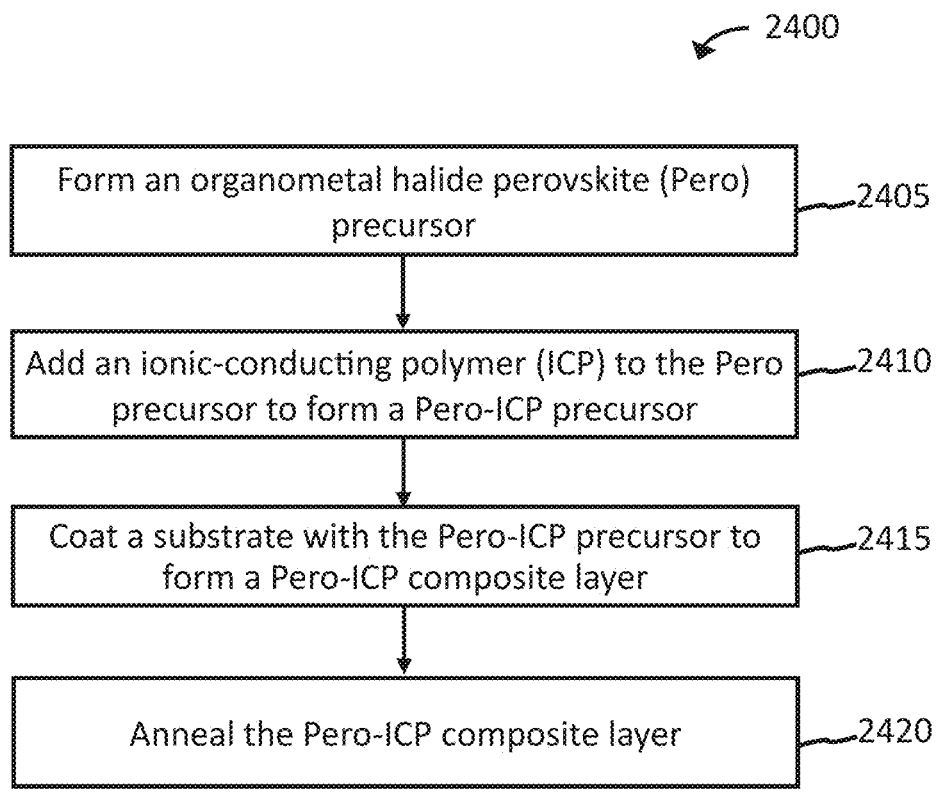
FIG. 24 is a flowchart of an exemplary method for producing a single layer thin film optoelectric device.

FIG. 24 is a flowchart of an exemplary method 2400 for producing a single layer thin film optoelectric device. At step 2405, an organometal halide perovskite (Pero) precursor may be formed. An ionic-conducting polymer (ICP) may be added at step 2410 to the Pero precursor to form a Pero-ICP precursor. A substrate may be coated at step 2415 with the Pero-ICP precursor to form a Pero-ICP composite layer. At step 2420, the Pero-ICP composite layer may be annealed.

Figure 25:
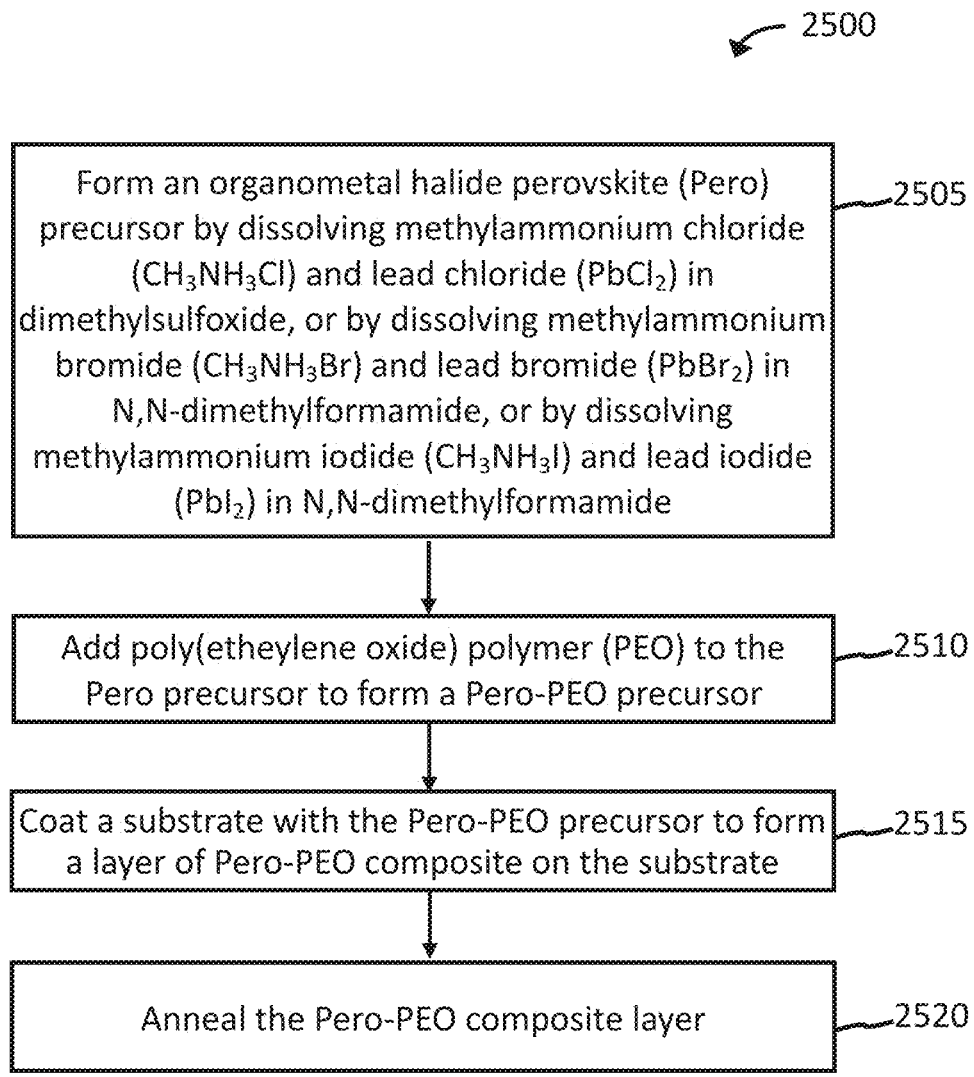
FIG. 25 is a flowchart of an exemplary method for producing a single layer thin film optoelectric device.

FIG. 25 is a flowchart of an exemplary method 2500 for producing a single layer thin film optoelectric device. At step 2505, An organometal halide perovskite (Pero) precursor may be formed by dissolving methylammonium chloride ($CH_3NH_3Cl$) and lead chloride ($PbCl_2$) in a dimethylsulfoxide, or by dissolving methylammonium bromide ($CH_3NH_3Br$) and lead bromide ($PbBr_2$) in N,N-dimethylformamide, or by dissolving methylammonium iodide ($CH_3NH_3I$) and lead iodide ($PbI_2$) in N,N-dimethylformamide. Poly(etheylene oxide) polymer (PEO) may be added at step 2510 to the Pero precursor to form a Pero-PEO precursor. A substrate may be coated at step 2515 with the Pero-PEO precursor to form a layer of Pero-PEO composite on the substrate. At step 2520, the Pero-PEO composite layer may be annealed.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

GLOSSARY OF CLAIM TERMS

Anneal: A process, typically thermal, used to further a chemical reaction and evaporate volatile components.

Conducting polymer: Organic polymers that conduct electricity.

Organometal halide: A compound containing at least one bond between a carbon atom of an organic compound and a metal and that also contains a halide ion.

Perovskite: A class of compounds with the same type of crystal structure as calcium titanium oxide ($CaTiO_3$) with the oxygen in the face centers.

Photoactive layer: The layer of an optoelectric device that absorbs or emits light.

Thin film optoelectronic device: An optoelectric device utilizing one or more layers of material ranging in thickness from fractions of a nanometer to several micrometers.

What is claimed is:

1. A single layer thin film optoelectronic device, comprising:
   an anode;
   a cathode;
   a polycrystalline photoactive layer positioned between the anode and the cathode and wherein a first side of the polycrystalline photoactive layer is adjacent to the anode and a second side of the polycrystalline photoactive layer is adjacent to the cathode; and
   wherein the polycrystalline photoactive layer comprises a methylammonium lead halide ($CH_3NH_3PbX$) deposited from a mixture of methylammonium halide ($CR_3NH_3X$) and lead halide ($PbX_2$) and ion-conducting polymer (ICP) in a solution of dimethylformamide or dimethylsulfoxide, and thermally annealed, and wherein the relative weight ratio of the ICP over the total weight of methylammonium halide and lead halide in the mixture is sufficient to facilitate migration of cations towards the cathode and anions toward the anode, resulting in formation of a p-i-n junction in the polycrystalline photoactive layer.

2. The device of claim 1, wherein the ICP comprises poly(ethylene oxide).

3. The device of claim 1, wherein a molar ratio of lead halide to methylammonium halide in the mixture is approximately 1:1.5.

4. The device of claim 1, wherein X comprises fluoride (F$^-$), chloride (Cl$^-$), bromide (Br$^-$), iodide (I$^-$), astatide (At$^-$), or mixtures thereof.

5. A single layer thin film optoelectronic device, comprising:
   an anode;
   a cathode;
   a polycrystalline photoactive layer positioned between the anode and the cathode and wherein a first side of the polycrystalline photoactive layer is adjacent to and in contact with the anode and a second side of the polycrystalline photoactive layer is adjacent to and in contact with the cathode; and
   wherein the polycrystalline photoactive layer comprises an organometal halide perovskite (Pero) and an ion-conducting polymer (ICP), wherein the Pero is dispersed in the ICP, and wherein the relative weight ratio of the ICP over the weight of the Pero in the polycrystalline photoactive layer is sufficient to facilitate migration of cations towards the cathode and anions toward the anode, resulting in formation of a p-i-n junction in the polycrystalline photoactive layer.

6. The optoelectronic device of claim 5, wherein the Pero comprises a mixture of AX and BX, where A is a cation, B is a metal, and X is a halide ion.

7. The optoelectronic device of claim 6, wherein A comprises methylammonium ($CH_3NH_3$), formamidinium ($NH_2CHNH_2$), cesium (Cs), or mixtures thereof.

8. The optoelectronic device of claim 6, wherein B comprises lead (Pb), tin (Sn), germanium (Ge), or mixtures thereof.

9. The optoelectronic device of claim 6, wherein X comprises fluoride ($F^-$), chloride ($Cl^-$), bromide ($Br^-$), iodide ($I^-$), astatide ($At^-$), or mixtures thereof.

10. The optoelectronic device of claim 6, the Pero comprises AX and BX in a ratio of approximately 1.5 mole AX to 1 mole BX.

11. The optoelectronic device of claim 5, wherein the ICP comprises oligomers or polymers of ethylene oxide, a polysaccharide polymer, or a conjugated polymer.

12. The optoelectronic device of claim 5, wherein the Pero comprises methylammonium lead halide ($CH_3NH_3PbX_3$), formamidinium lead halide ($NH_2CHNH_2PbX_3$), cesium lead halide ($CsPbX_3$), or mixtures thereof, wherein X is a halide.

13. A single layer thin film optoelectronic device, comprising:
an anode;
a cathode;
a polycrystalline photoactive layer positioned between the anode and the cathode and wherein a first side of the polycrystalline photoactive layer is adjacent to and in contact with the anode and a second side of the polycrystalline photoactive layer is adjacent to and in contact with the cathode; and
wherein the polycrystalline photoactive layer comprises an organometal halide perovskite (Pero) and an ion-conducting polymer (ICP), and wherein the relative weight ratio of the ICP over the weight of the Pero in the polycrystalline photoactive layer is sufficient to facilitate migration of cations towards the cathode and anions toward the anode, resulting in formation of a p-i-n junction in the polycrystalline photoactive layer, wherein the relative weight ratio of the ICP over the weight of the Pero is between about 5% and about 75%.

* * * * *